US007447324B2

(12) United States Patent
Ogawa et al.

(10) Patent No.: US 7,447,324 B2

(45) Date of Patent: Nov. 4, 2008

(54) PIEZOELECTRIC SOUNDING BODY AND ELECTRONIC DEVICE USING THE SAME

(75) Inventors: Tatsuyuki Ogawa, Haruna-Machi (JP); Yasukazu Tokuhisa, Haruna-Machi (JP); Hiroaki Uenishi, Haruna-Machi (JP); Shigeo Ishii, Haruna-Machi (JP); Yoshiyuki Watanabe, Haruna-Machi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 273 days.

(21) Appl. No.: 11/390,620

(22) Filed: Mar. 28, 2006

(65) Prior Publication Data

US 2006/0221770 A1 Oct. 5, 2006

(30) Foreign Application Priority Data

Mar. 31, 2005 (JP) ............................ 2005-100867

(51) Int. Cl.
*B06B 1/06* (2006.01)
*H01L 41/083* (2006.01)

(52) U.S. Cl. ........................ 381/190; 381/191; 367/140

(58) Field of Classification Search ................. 367/140, 367/163, 164, 174, 910; 340/384.1; 381/173, 381/190; 84/730; 29/25.35; 310/328, 348
See application file for complete search history.

(56) References Cited

U.S. PATENT DOCUMENTS 3,815,129 A * 6/1974 Sweany ................... 340/384.6
5,142,511 A * 8/1992 Kanai et al. ................. 367/164
5,936,327 A * 8/1999 Takahashi et al. ........... 310/366
6,191,520 B1 * 2/2001 Maruyama et al. ..... 310/323.06
6,291,932 B1 * 9/2001 Maruyama et al. .......... 310/366
6,668,437 B1 * 12/2003 Maruyama et al. ......... 29/25.35
6,951,048 B2 * 10/2005 Maruyama et al. ......... 29/25.35
2004/0088842 A1 * 5/2004 Maruyama et al. ......... 29/25.35

FOREIGN PATENT DOCUMENTS

JP 2003-47092 A 2/2003
JP 2003158794 A * 5/2003
JP 2006287480 A * 10/2006

* cited by examiner

*Primary Examiner*—Thomas H. Tarcza
*Assistant Examiner*—Lisa Yung
(74) *Attorney, Agent, or Firm*—Knobbe Martens Olson & Bear LLP

(57) ABSTRACT

Electrode layers 22A-22C, 24A-24C are formed on both main surfaces of each of piezoelectric layers 20A, 20B. Voltages of different polarities are respectively applied to the electrode layers next to each other on the same main surface and to the electrode layers opposing to each other via the piezoelectric layer. Projection forms 30, 32 are formed in respective edges of the second electrode layers 22B, 24B, each of which extends into the opposite area. Through-holes are formed in the piezoelectric layer 20A, 20B, in positions off a division line 38. The electrode layers 22A-22C are connected together by the through-holes 26A, 26B and the projection form 30, to have an equal potential. Those are lead from the diaphragm to the outside, thus reducing the overall thickness.

10 Claims, 11 Drawing Sheets

PIEZOELECTRIC SOUNDING BODY AND ELECTRONIC DEVICE USING THE SAME

BACKGROUND OF THE INVENTION

1. Field of the Invention

The present invention relates to a piezoelectric sounding body for a sound producer and an electronic apparatus using same, and more particularly to reducing the thickness of a piezoelectric sounding body and electronic device.

2. Description of the Related Art

Piezoelectric sounding bodies are broadly used as simple electroacoustic transducer means. Particularly in recent years, they are frequently used for speakers and the like, in the field of cellular phones and personal digital assistants. The piezoelectric sounding body is structured by bonding piezoelectric elements 504, 510 on the both surfaces of a diaphragm 502, as exemplified in FIG. 11. The piezoelectric element 504 is structured by forming electrode layers 508A, 508B on the both surfaces of a piezoelectric member 506. This is bonded by, say, a conductive adhesive on the surface of a diaphragm 502 made of metal or the like. The other piezoelectric element 510 is similarly structured by forming electrode layers 508C, 508D on the both surfaces of a piezoelectric member 506.

The electrode layers 508A, 508D are respectively led to the outside through conductive means such as lead wires 512A, 512B. The other electrode layers 508B, 508C are held equal in potential to the diaphragm 502 and led from the diaphragm 502 to the outside through a lead wire 512C. For example, JP-A-2003-47092 discloses a structure similar to the electrode lead structure like the above.

However, in the related art, the lead wires 512A 512C and solder 514A-514C are required to lead the electrodes to the outside. Of those, the lead wires 512A, 512B have solder connections that are provided respectively on the electrodes 508A, 508D over the surfaces of the piezoelectric elements 504, 510. This forms a factor to increase the thickness of the piezoelectric sounding body 500 itself. For example, provided that the diaphragm 502 has a thickness 30 μm, the piezoelectric elements 504, 510 each have a thickness 60 μm and the solder connections 514A, 514B with the lead wires 512A, 512B each have a height 160 μm, then the overall thickness of the piezoelectric sounding body 500 amounts to 470 μm. Of the thickness, the solder connections with the lead wires 512A, 512B have totally a thickness of 320 μm as required in leading the electrodes. This occupies nearly 70% of the overall thickness of the piezoelectric sounding body 500. Meanwhile, in the related art, the connections of the lead wires 512A, 512B at the upper and lower surfaces do not allow the lead wires 512A, 512B to be placed in close contact with the diaphragm 502. Thus, the reliability is possibly insufficient for the severity of piezo-driving over a long time. For this reason, such a useless thickness, if eliminated by an improved electrode lead structure, can conveniently promote to reduce the thickness of a piezoelectric sounding body and an electronic device using same.

SUMMARY OF THE INVENTION

It is an object of the present invention to reduce the thickness of a piezoelectric sounding body by improving the electrode structure, thereby improving the freedom of mounting to an electronic device and reducing the thickness of the electronic device itself. Another object of the invention is to improve the reliability of electrode lead. A further object of the invention is to simplify the manufacturing process and diminishing materials by virtue of an improved lead structure.

In one aspect of the invention, there is provided a piezoelectric sounding body for a sound producer, comprising: a piezoelectric element comprising at least one piezoelectric layer and electrode layers respectively provided on main surfaces of the piezoelectric layer in a manner sandwiching the piezoelectric layer, wherein each main surface of the piezoelectric layer is divided into multiple sections, and each electrode layer is divided, separated, and disposed respectively on the multiple sections in positions which are substantially the same between the both main surfaces sandwiching the piezoelectric layer; a diaphragm having surfaces to at least one of which the piezoelectric element is bonded; and a plurality of connectors each connecting, thicknesswise of the piezoelectric layer, one section of the electrode layer on the main surface of the piezoelectric layer to one section of the other opposing electrode layer via the piezoelectric layer corresponding to another section of the electrode layer that is adjacent to the one section of the electrode layer on the same main surface, in a position where the one section of the other opposing electrode layer overlaps any section of the electrode layer on said main surface. This structure allows for leading electrodes all at the diaphragm, thus reducing the overall thickness and improving the reliability.

In one embodiment, at least one of the plurality of connecting means has a through-hole. In another embodiment, a plurality of lead electrodes are provided, on a main surface of the diaphragm, that are conductively connected respectively to the divided multiple sections of the electrode layer on each main surface of the piezoelectric layer. In still another embodiment, each electrode layer is divided into the multiple sections using a division line, as a boundary, not passing a center of the main surface of the piezoelectric layer, or each electrode layer on the same main surface of the piezoelectric layer is divided into the multiple sections arranged substantially concentric about a center of the piezoelectric layer. The structure in any of the foregoing provides the effect of manufacturing process simplification and material diminishing by a simplified lead structure.

In an embodiment, the present invention provides a piezoelectric sounding body comprising:

(a) a piezoelectric element comprising:

(i) at least one piezoelectric layer having upper and lower surfaces; and (ii) upper and lower electrode layers sandwiching each piezoelectric layer, said upper and lower electrode layers being each divided into multiple sections disposed on the respective surfaces of the piezoelectric layer, positions of the multiple sections of the upper electrode layer on the upper surface of the piezoelectric layer substantially or nearly correspond to positions of the multiple sections of the lower electrode layer on the lower surface of the piezoelectric layer, respectively, in a thickness direction of the piezoelectric layer via the piezoelectric layer, with the exception of a protruding portion provided in each given section of the upper or lower electrode layer and protruding toward an adjacent section of the upper or lower electrode, wherein each given section of the upper or lower electrode layer overlaps the adjacent section of the lower or upper electrode layer, respectively, at the protruding portion in the thickness direction of the piezoelectric layer;

(b) connectors, each connecting each section of the upper and lower electrode layers at the protruding portion; and (c) a diaphragm having surfaces, to at least one of which surfaces the piezoelectric element is attached. The protruding portion may have an area which is less than about 10% (e.g., about 5% or less) of the area of the given section of the upper or lower electrode layer.

In another aspect of the invention, there is provided an electronic device characterized by using a piezoelectric sounding body as set forth in any of the foregoing.

In all of the aforesaid embodiments, any element used in an embodiment can interchangeably or additionally be used in another embodiment unless such a replacement is not feasible or causes adverse effect. Further, the present invention can equally be applied to apparatuses and methods.

For purposes of summarizing the invention and the advantages achieved over the related art, certain objects and advantages of the invention have been described above. Of course, it is to be understood that not necessarily all such objects and advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspect, features and advantages of this invention will become apparent from the detailed description of the preferred embodiments which follow.

BRIEF DESCRIPTION OF THE DRAWINGS

These and other features of this embodiment will now be described with reference to the drawings or preferred embodiments which are intended to illustrate and not to limit the invention.

FIGS. 2A and 2B are views showing the first embodiment wherein FIG. 2A is a perspective view showing an exterior view while FIG. 2B is a sectional view, taken along line #A-#A in FIG. 2A, as viewed in a direction of the arrow;

Explanation of Symbols

10: piezoelectric sounding body; 12: diaphragm; 13: insulation plate; 13A:protrusion; 14, 16: printed conductor patterns; 14A, 16A: lead areas; 18: piezoelectric element; 20A-20C: piezoelectric layers; 22A-22D, 24A-24D: electrode layers; 26A-26C, 28A-28C: through-holes; 30, 32, 34, 36: projection forms; 38: division line; 40: piezoelectric element; 42A, 42B: piezoelectric layers; 44A-44C, 46A-46C: electrode layers; 48A, 48B, 50A, 50B: through-holes; 52, 54, 56, 58, 60, 62: projection forms; 64: division line; 70: piezoelectric sounding body; 72: piezoelectric element; 100: piezoelectric sounding body; 102: diaphragm; 104: insulation sheet; 106, 108: printed conductor patterns; 106A/108A: lead areas; 110: piezoelectric element; 112A, 112B: piezoelectric layers; 114A-114B, 116A-116C: electrode layers; 118A, 118B, 120A, 120B: through-holes; 122, 124: projection forms; 126: division line; 150: piezoelectric sounding body; 152: diaphragm; 154: insulation sheet; 156, 158: printed conductor patterns; 160: piezoelectric element; 162A, 162B: piezoelectric layers; 164A-164C, 166A-166C: electrode layers; 168A, 168B, 170A, 170B: through-holes; 172, 174: projection forms; 176: division line; 178, 180: solder; 182, 184: leads; 200, 220, 240: piezoelectric element; 202, 222, 242: piezoelectric layer; 204, 206, 224, 226, 244, 246: electrode layers; 208, 228, 248: division line; 300: piezoelectric sounding body; 302: diaphragm; 304: insulation sheet; 304A: protrusion; 306, 310: printed conductor patterns; 306A, 310A: lead areas; 308: slit; 312: insulation layer; 320: piezoelectric element; 322A, 322B: piezoelectric layers; 324A-324C, 326A-326C: electrode layer; 328A, 32BB, 330A, 330B: through-holes; and 332, 334: projection form.

DETAILED DESCRIPTION OF THE PREFERRED EMBODIMENTS

The best mode for carrying out the present invention will now be described in detail by way of embodiments. It should be noted that the embodiments are not purported to limit the invention.

In the present disclosure where conditions and/or structures are not specified, the skilled artisan in the art can readily provide such conditions and/or structures, in view of the present disclosure, as a matter of routine experimentation.

First Embodiment

Figure 1:
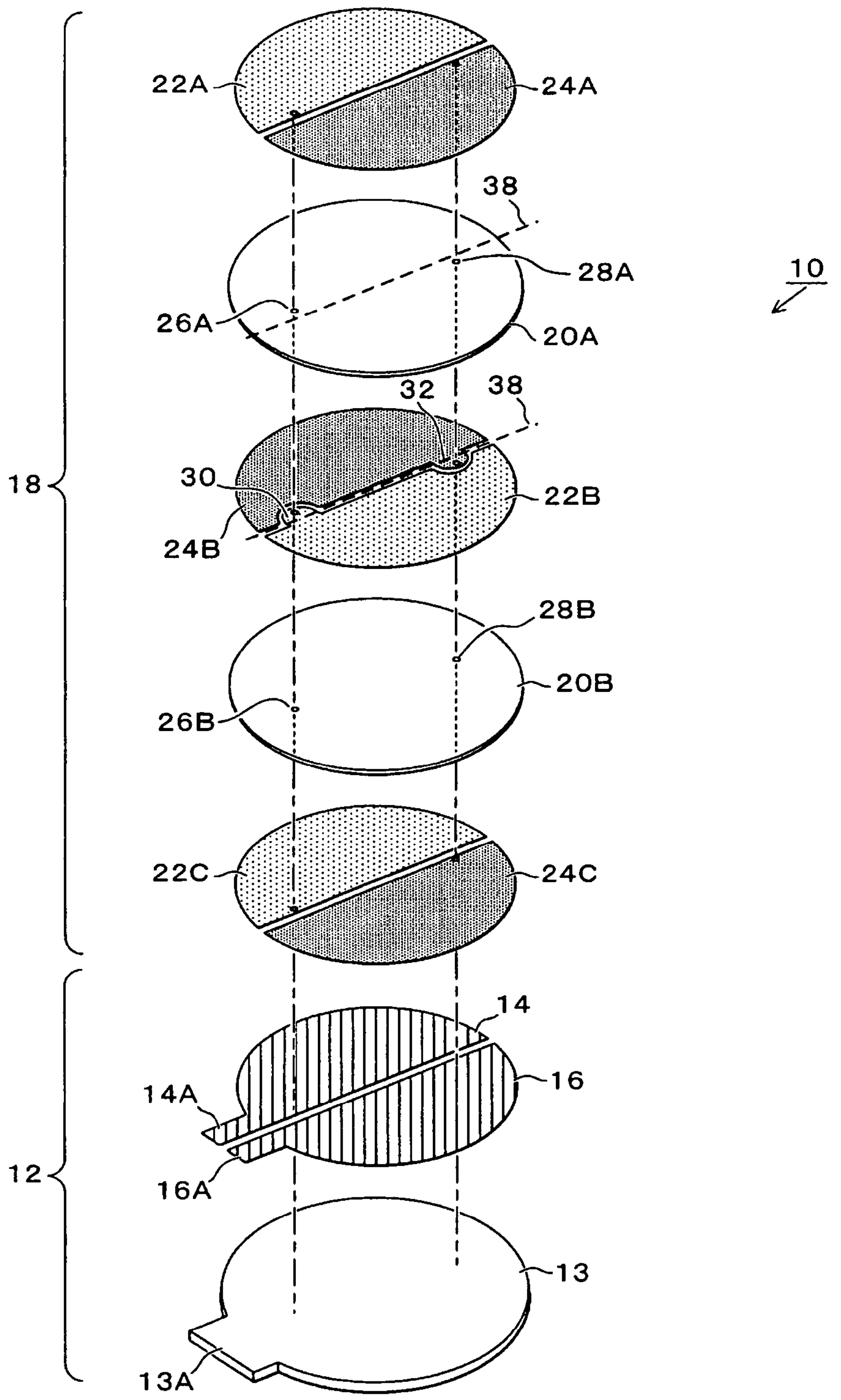
FIG. 1 is an exploded perspective view showing a structure of a first embodiment of the present invention.
Figure 2:
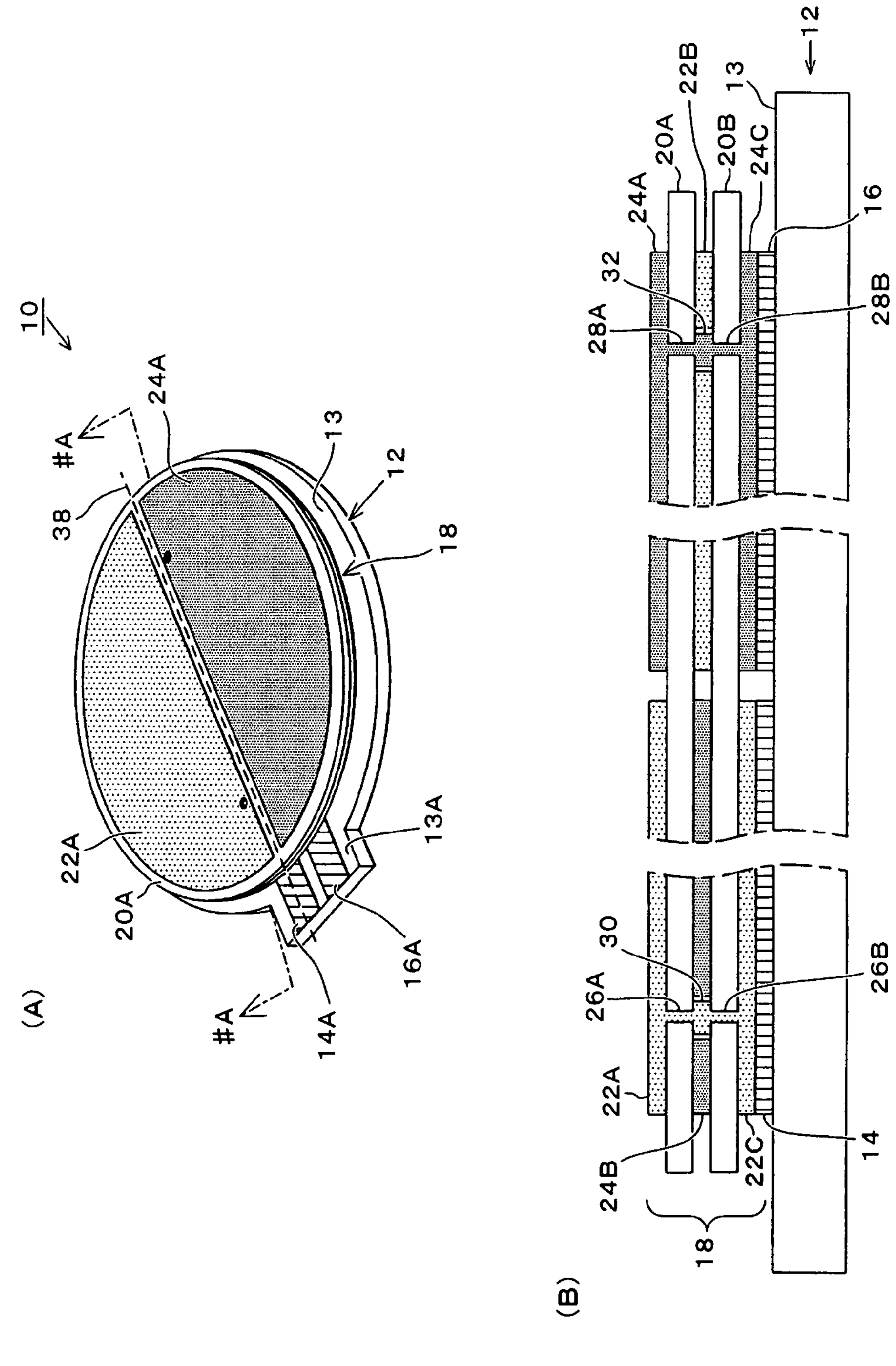
Figure 3:
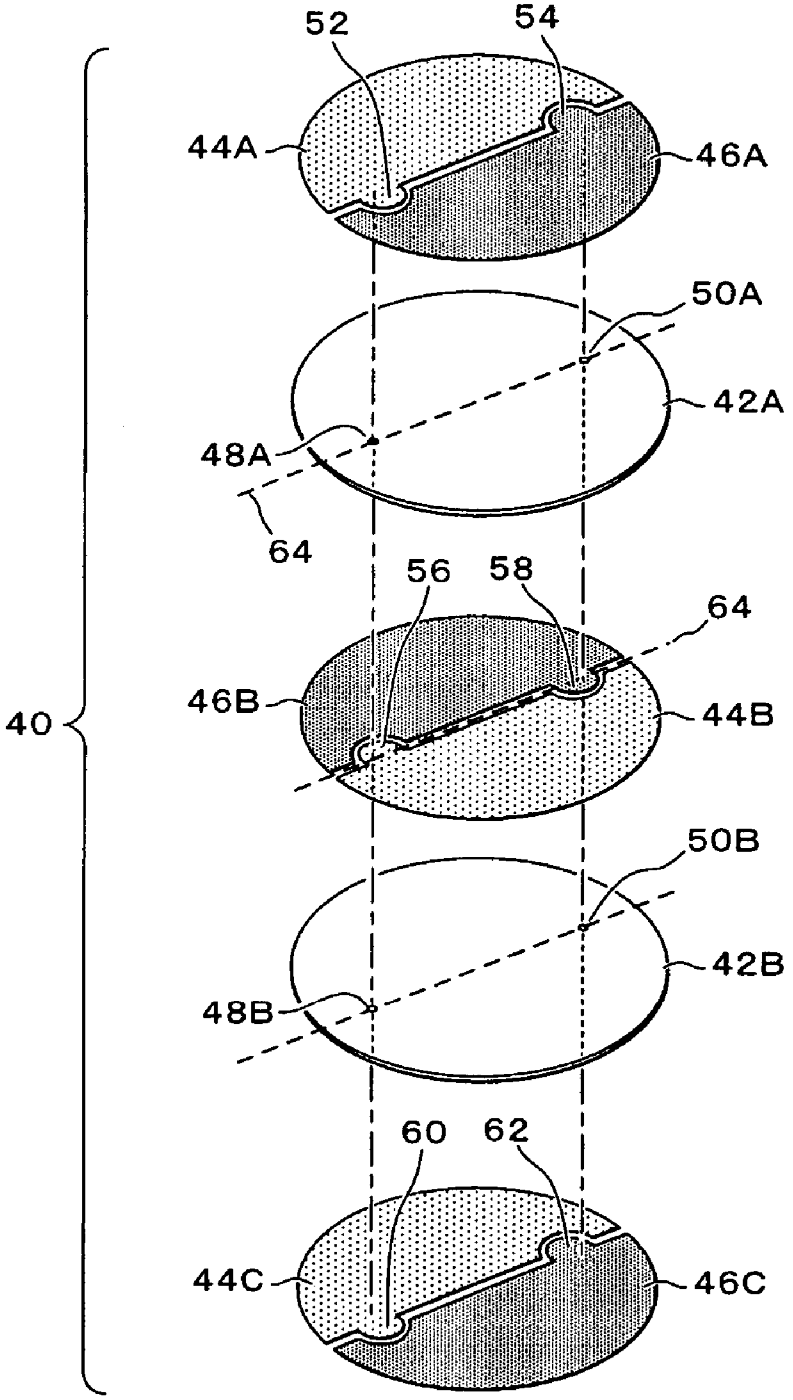
FIG. 3 is an exploded perspective view showing a structure of a comparative example with the first embodiment.

Referring to FIGS. 1 to 3, description is now made on a first embodiment of the invention. FIG. 1 is an exploded perspective view showing a structure in the present embodiment. FIG. 2A is an exterior perspective view showing the entire of the present embodiment while FIG. 2B is a sectional view of the FIG. 1 structure, taken along line #A-#A, as viewed in the arrow. FIG. 3 is an exploded perspective view showing a structure of a comparative example. As shown in the figures, a piezoelectric sounding body 10 is made in a unimorph structure that a nearly circular piezoelectric element 18 is bonded on one main surface of a nearly circular diaphragm 12.

The diaphragm 12 is structured by providing a pair of printed conductor patterns 14, 16 on one main surface of an insulation sheet 13 formed by a material which has insulation property and excellent flexibility, for example, an insulation film, say, of PET (polyethylene terephthalate) through use of, say, a conductive Ag paste. Note that the conductive Ag paste is mere one example, i.e., the thin conductive film may be provided by sputtering or so. In the insulation plate 13, a protrusion 13A is provided projecting, outward thereof, in an extending direction of a straight line passing the gap of between the one pair of printed conductor patterns 14, 16. The printed conductor patterns 14, 16 are respectively connected with lead areas 14A, 16A formed on the surface of the protrusion 13A.

The piezoelectric element 18 is structured by an alternate lamination of piezoelectric layers 20A, 20B and electrode layers 22A-22C, 24A-24C, so that the electrode layers are opposed sandwiching each of the piezoelectric layers. The electrode layers 22A-22C, 24A-24C use baked conductive layers, such as of Ag or Ag—Pd alloy. On one main surface of the nearly circular piezoelectric layer 20A (on the upper surface in FIG. 1), a pair of electrode layers 22A, 24A, to which signal voltages in different polarities are to be applied, are formed on respective areas that the main surface of the piezoelectric layer 20A is divided into nearly equal two parts, in a manner spaced from each other. On the respective surfaces of the second piezoelectric layer 20B, there are formed a pair of electrode layers 22B, 24B and a pair of electrode layers 22C, 24C, to which signal voltages in different polarities are to be applied. Those electrode layers 22B, 24B, 22C, 24C are each semicircular in form with respect to a division line 38, as a boundary, passing nearly the center of the piezoelectric layer 20B. Meanwhile, those are arranged such that a signal voltage in the same polarity is applied to the electrode layers 22A, 22B, 22C while a signal voltage in the same polarity is applied to the electrode layers 24A, 24B, 24C. Namely, the arrangement is made in a manner to apply signal voltages in different polarities to the opposite electrode layers sandwiching the piezoelectric layer.

Through-holes 26A, 28A are provided in the piezoelectric layer 20A while through-holes 26B, 28B are formed in the piezoelectric layer 20B. Meanwhile, projection forms 30, 32 are formed in respective opposite edges of the second electrode layers 22B, 24B, each of which extends into the opposite area beyond the division line 38. Incidentally, the through-holes 26A, 28A, 26B, 28B are formed in positions off the division line 38, as shown in FIG. 1. The electrode layers 22A-22C are electrically connected together nearly straight in a thickness direction thereof through use of the through-holes 26A, 26B and the projection form 30, to have the common potential. Meanwhile, the electrode layers 24A-24C are electrically connected together nearly straight in a thickness direction thereof through use of the through-holes 28A, 28B and the projection form 32, to have the common potential. Bonding is done through a conductive adhesive, not shown, to place the electrode layer 22C in contact with one print conductor pattern 14 provided on the main surface of the diaphragm 12 and the electrode layer 24C in contact with the other print conductor pattern 16.

In the piezoelectric sounding body 10 thus structured, electrodes taken respectively out of the lead areas 14A, 16B, serving as extension electrodes, of the printed conductor patterns 14, 16 by way of leads, not shown, and connected to a power supply (not shown). By applying a signal voltage, say, positively to one printed conductor pattern 14 and negatively to the other printed conductor pattern 16, driving can be effected to the piezoelectric sounding body 10. Namely, because of the capability of taking the electrodes out of the surface of the diaphragm 12 on which the piezoelectric element 18 is bonded without taking electrodes at the surface of the piezoelectric element 18, the piezoelectric sounding body 10 can be greatly reduced in thickness as compared to the related art described before.

Description is now made on the difference of from the comparative example shown in FIG. 3. The comparative example has a piezoelectric element 40 structured by a lamination of piezoelectric layers 42A, 42B and electrode layers 44A-44C, 46A-46C. The electrode layers are formed with respective projection forms 52-62 for use in electric connections thereof via through-holes 48A, 48B, 50A, 50B provided in the piezoelectric layers 42A, 42B. In the comparative example, the through-holes 48A, 48B, 50A, 50B are provided on the division line 64 along which the electrode layers are separated on the same main surface. Although the electrode layers use a metal, such as Ag, strength is inferior because there exist, substantially, almost no electrodes (metal) on the division line 64. Accordingly, connection via through-holes, if done in such an area almost no metal exists, possibly lowers reliability. Instead, by providing through-holes in positions off the division line 38 and providing conductive connections in overlap positions with any of the electrode layers as in the piezoelectric element 18 of the present embodiment, strength can be raised to improve the reliability.

Thus, the first embodiment provides the following effects.

(1) On one main surface of a diaphragm 12, bonded is a piezoelectric element 18 having a pair of electrode layers arranged, spaced to each other, on respective areas of the main surface of the piezoelectric layer 20A, 20B. The electrode layers are arranged so that signal voltages in different polarities can be applied to between the electrode layers on the same surface of the piezoelectric layer and to between the electrode layers opposed sandwiching the piezoelectric layer.

The electrode layers 22A-22C, to which a signal voltage in the same polarity is to be applied, are connected together in the thickness direction thereof through use of the through-holes 26A, 2 GB and the projection form 30. The electrode layers 24A-24C are connected together in the thickness direction thereof through use of the through-holes 28A, 28B and the projection forms 32. This allows for taking electrodes completely out of the diaphragm 12 and hence for reducing the overall thickness. In addition, simplifying the electrode-taking structure provides a manufacturing-process simplification and material-diminishing effect.

(2) Because through-hole connection is done in a position off the division line 38, i.e. in a position overlapping with any of the electrode layers, strength can be increased to improve the reliability of conductive connections.

(3) The diaphragm 12 is printed with conductor patterns 14, 16 that are nearly equal in area to the respective electrode layers, to bond the electrode layers thereon. This can enhance the reliability of conductor connections and electrode leading during performing a piezo-driving.

Second Embodiment

Figure 4:
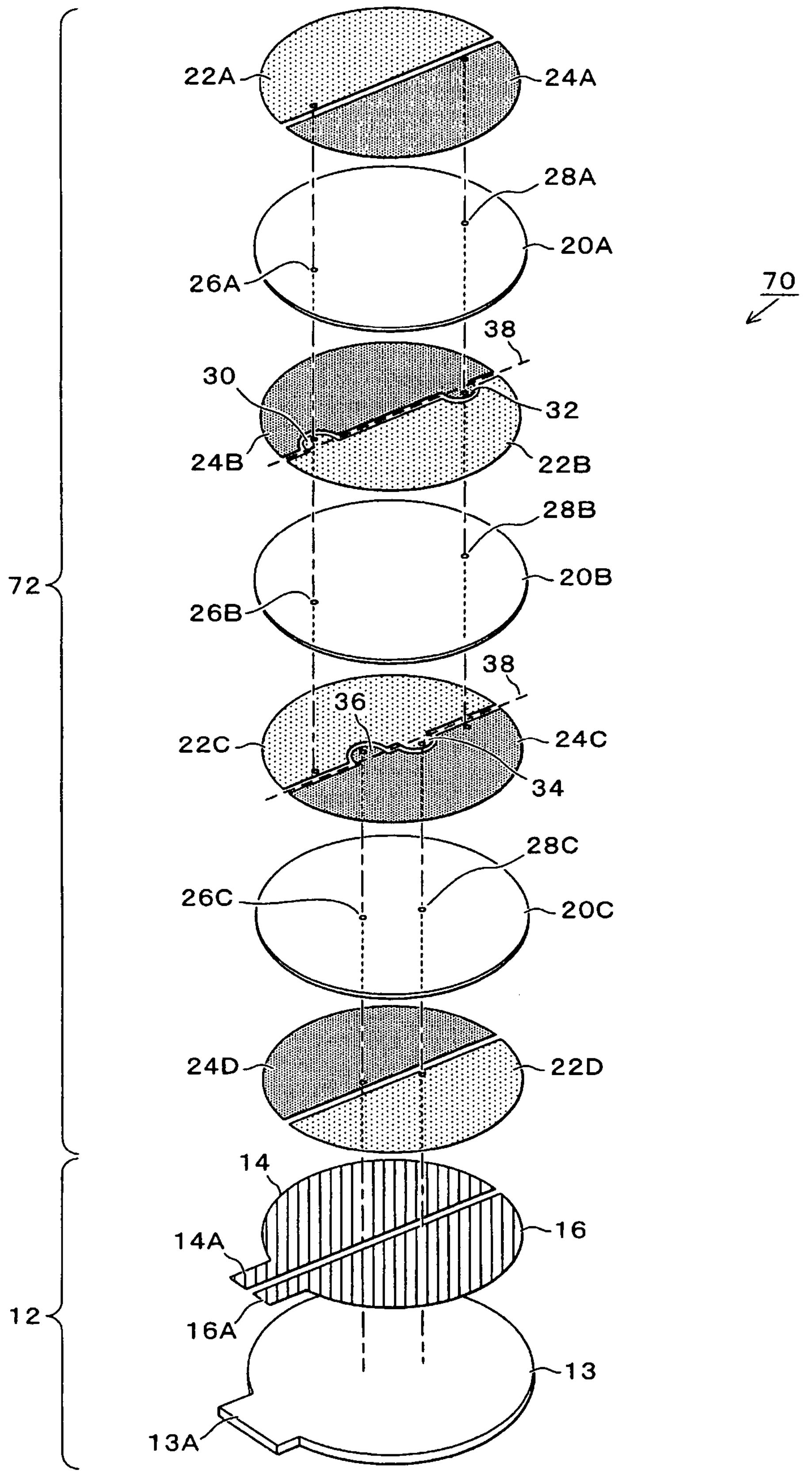
FIG. 4 is an exploded perspective view showing a structure of a second embodiment of the invention.

Referring to FIG. 4, description is now made on a second embodiment of the invention. Note that like numerals are used for like or corresponding elements to those of the first embodiment (this is the case with the ensuing embodiments). FIG. 4 is an exploded perspective view of the present embodiment; Although the first embodiment was the example the piezoelectric element having two piezoelectric layers was provided on the main surface of the diaphragm, this embodiment concerns an example using a piezoelectric element having three piezoelectric layers. As shown in FIG. 4, a piezoelectric sounding body 70 in this embodiment is made in a unimorph structure that a piezoelectric element 72 is bonded on one main surface of a diaphragm 12, thus providing nearly a circular form in the entirety. In the diaphragm 12, a pair of printed conductor patterns 14, 16 are formed as lead electrode on the surface of an insulation sheet 13, similarly to the first embodiment.

The piezoelectric element 72 is structured by an alternate lamination of piezoelectric layers 20A-20C and electrode layers 22A-22D, 24A-24D, so that the electrode layers are opposed sandwiching each of the piezoelectric layers. The piezoelectric layers 20A-20C and the electrode layers 22A-22D, 24A-24D use the materials similar to those in the first embodiment. On one main surface of the nearly circular piezoelectric layer 20A (on the upper surface in FIG. 4), a pair of electrode layers 22A, 24A, to which signal voltages in different polarities are to be applied, are formed on respective areas that the main surface of the piezoelectric layer 20A is divided into nearly equal two parts, in a manner spaced from each other. On the surface of the second piezoelectric layer 20B (on the upper surface in FIG. 4), a pair of electrode layers 22B, 24B are formed similarly, to which signal voltages in different polarities are to be applied. Meanwhile, projection forms 30, 32 are formed in respective opposite edges of the electrode layers 22B, 24B, each of which extends into the opposite area beyond the division line 38.

On the surface of the third piezoelectric layer 20C, a pair of electrode layers 22C, 24C are formed similarly. Projection forms 34, 36 are formed in respective opposite edges of the electrode layers 22C, 24C at around the center of those, each of which extends into the opposite area. Furthermore, a pair of electrode layers 22D, 24D are formed similarly, on the backside of the piezoelectric layer 20C. Meanwhile, through-holes 26A-26C, 28A-28C are formed in the piezoelectric layers 20A-20C, in proper positions off the division line 38.

In the piezoelectric element 72 thus structured, the electrode layers 22A-22D are connected together nearly straight in the thickness direction of the piezoelectric element 72 through use of the through-holes 26A, 26B, 28C and the projection forms 30, 34. The electrode layers 24A-24D are connected together nearly straight in the thickness direction through use of the through-holes 28A, 28B, 26C and the projection forms 32, 36. Incidentally, similarly to the first embodiment, through-hole connections are in positions off the division line 38, i.e. in positions each overlapping with any of the electrode layers. Then, bonding is done to place the electrode layer 24D in contact with one print conductor pattern 16 and the electrode layer 24D in contact with the other print conductor pattern 14. Electrodes are lead out of the printed conductor patterns 14, 16 and connected to a power source, not shown. In this manner, the present embodiment can obtain the effects of manufacturing process simplification, material diminishing effect, conductor-connection and electrode-leading reliability improvements similarly to the first embodiment even if the number of piezoelectric layers laminated is increased.

Third Embodiment

Figure 5:
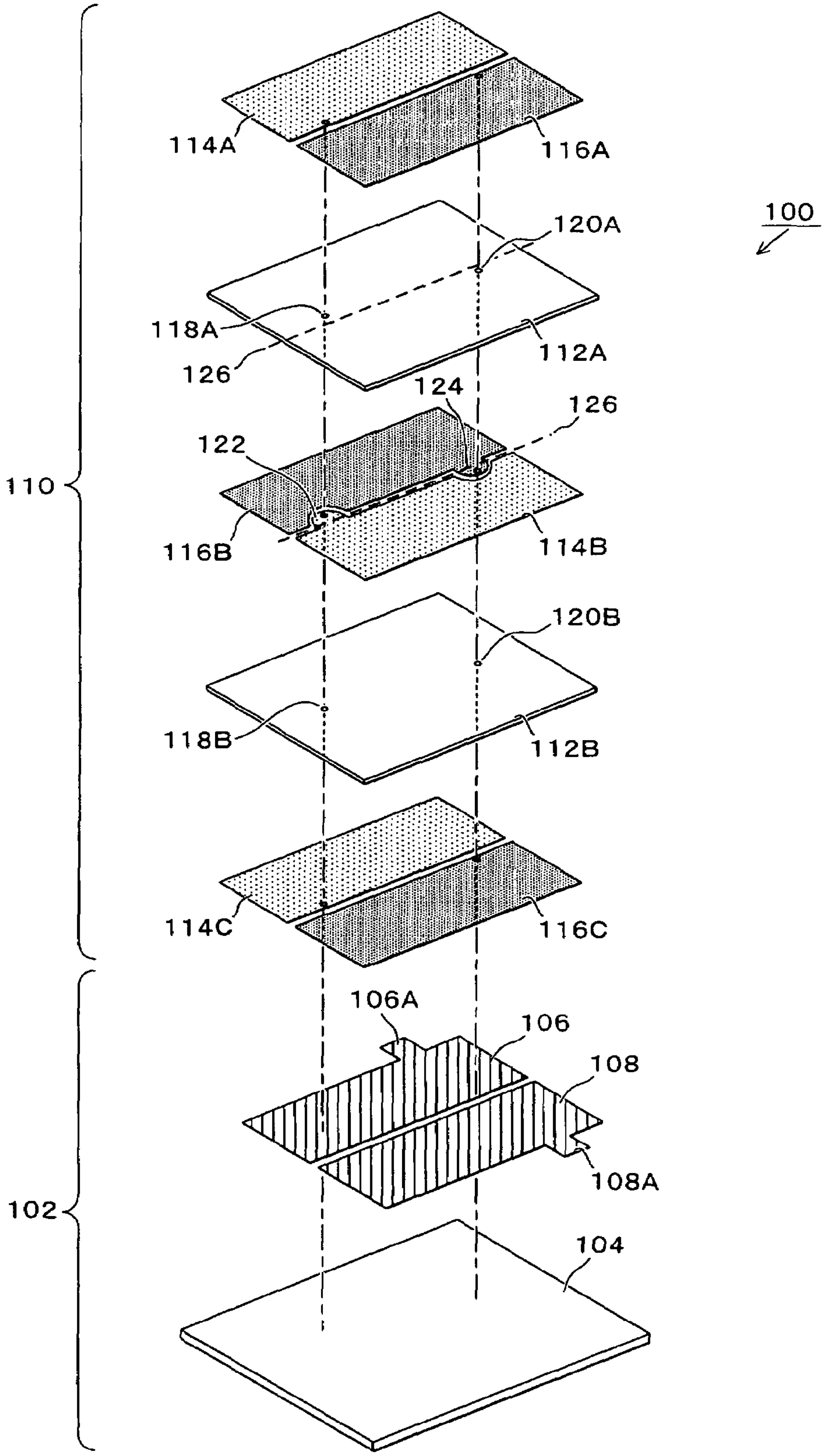
FIG. 5 is an exploded perspective view showing a structure of a third embodiment of the invention.
Figure 6:
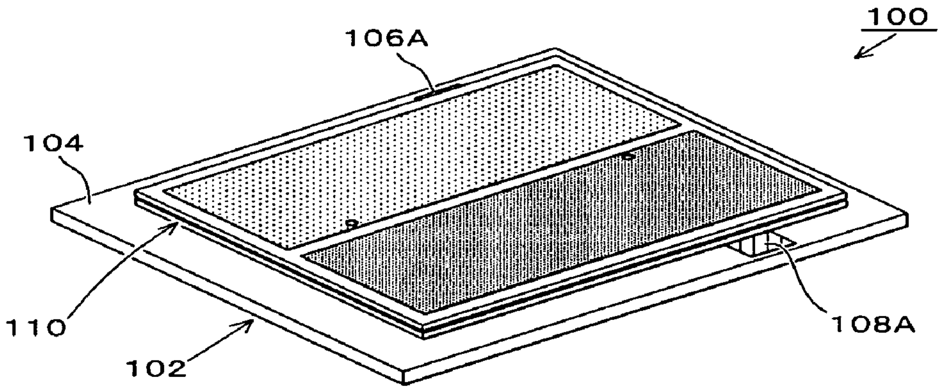
FIG. 6 is a perspective view showing an exterior of the third embodiment.

Referring to FIGS. 5 and 6, description is now made on a third embodiment of the invention. FIG. 5 is an exploded perspective view of the present embodiment while FIG. 6 is an exterior perspective view showing the entire of the present embodiment. Although the first and second embodiments each had the piezoelectric sounding body formed nearly circular in the entire form, the present embodiment has a counterpart made nearly rectangular in form. As shown in FIGS. 5 and 6, a piezoelectric sounding body 100 is made in a unimorph structure that a piezoelectric element 110 is bonded on one main surface of a diaphragm 102. In the diaphragm 102, a pair of printed conductor patterns 106, 108, for use as lead electrodes, are formed on the surface of an insulation sheet 104, similarly to the foregoing embodiments. The printed conductor patterns 106, 108 respectively have protruding lead areas 106A, 108A. Meanwhile, the piezoelectric element 110 is structured by an alternate lamination of piezoelectric layers 112A, 112B and electrode layers 114A-114C, 116A-116C, so that the electrode layers are opposed sandwiching each of the piezoelectric layers. The piezoelectric layers 112A/112B and the electrode layers 114A-114C, 116A-116C respectively use, say, the materials similar to those in the first embodiment.

The piezoelectric element 110 is similar in basic structure to the first embodiment excepting that its piezoelectric layers 112A, 112B and electrode layers 114A-114C, 116A-116C are nearly rectangular in form. Namely, in the piezoelectric layer 112A, 112B, through-holes 118A, 118B, 120A, 120B are formed in proper positions off a division line 126 passing the center of the main surface and splitting it into nearly two parts. Projection forms 122, 124 are formed in respective opposite edges of the second electrode layers 114B, 116B, each of which extends into the opposite area beyond the division line 126.

In this structure, the electrode layers 114A-114C, to which a signal voltage in the same polarity is to be applied, are conductively connected together through use of the through-holes 118A, 118B and the projection form 122. The electrode layer 114C is bonded onto one printed conductor patterns 106 of the diaphragm 104. Meanwhile, the electrode layers 116A-116C are also conductively connected together through use of the through-holes 120A, 120B and the projection form 124. The electrode layer 116C is bonded onto the other printed conductor patterns 108. By connecting, say, leads respectively to the lead areas 106A, 108B of the printed conductor patterns 106, 108 through solder, signal voltage can be applied to the piezoelectric sounding body 100. The basic operation and effect of this embodiment is similar to that of the first embodiment.

Fourth Embodiment

Figure 7:
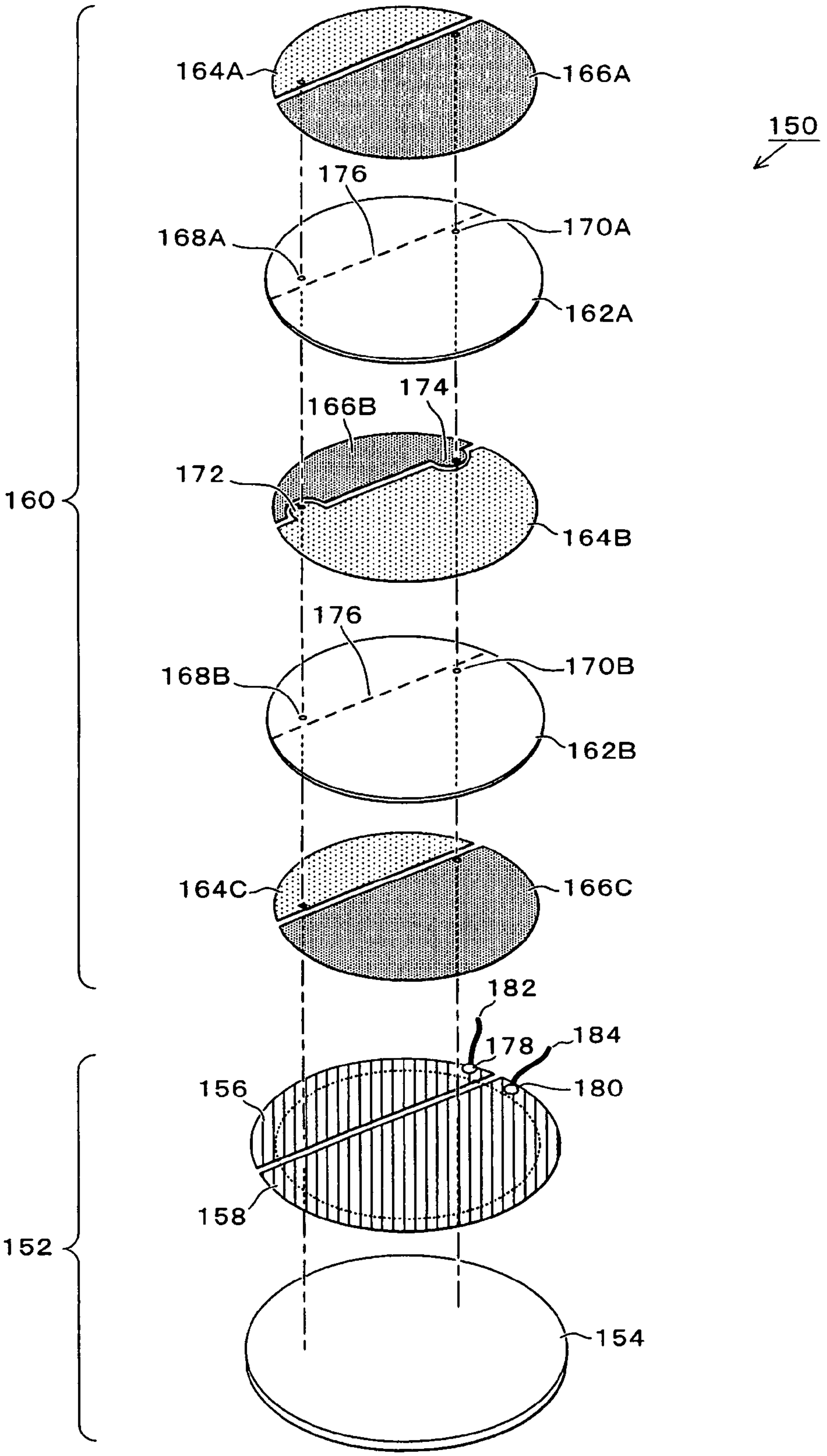
FIG. 7 is an exploded perspective view showing a structure of a fourth embodiment of the invention.
Figure 8:
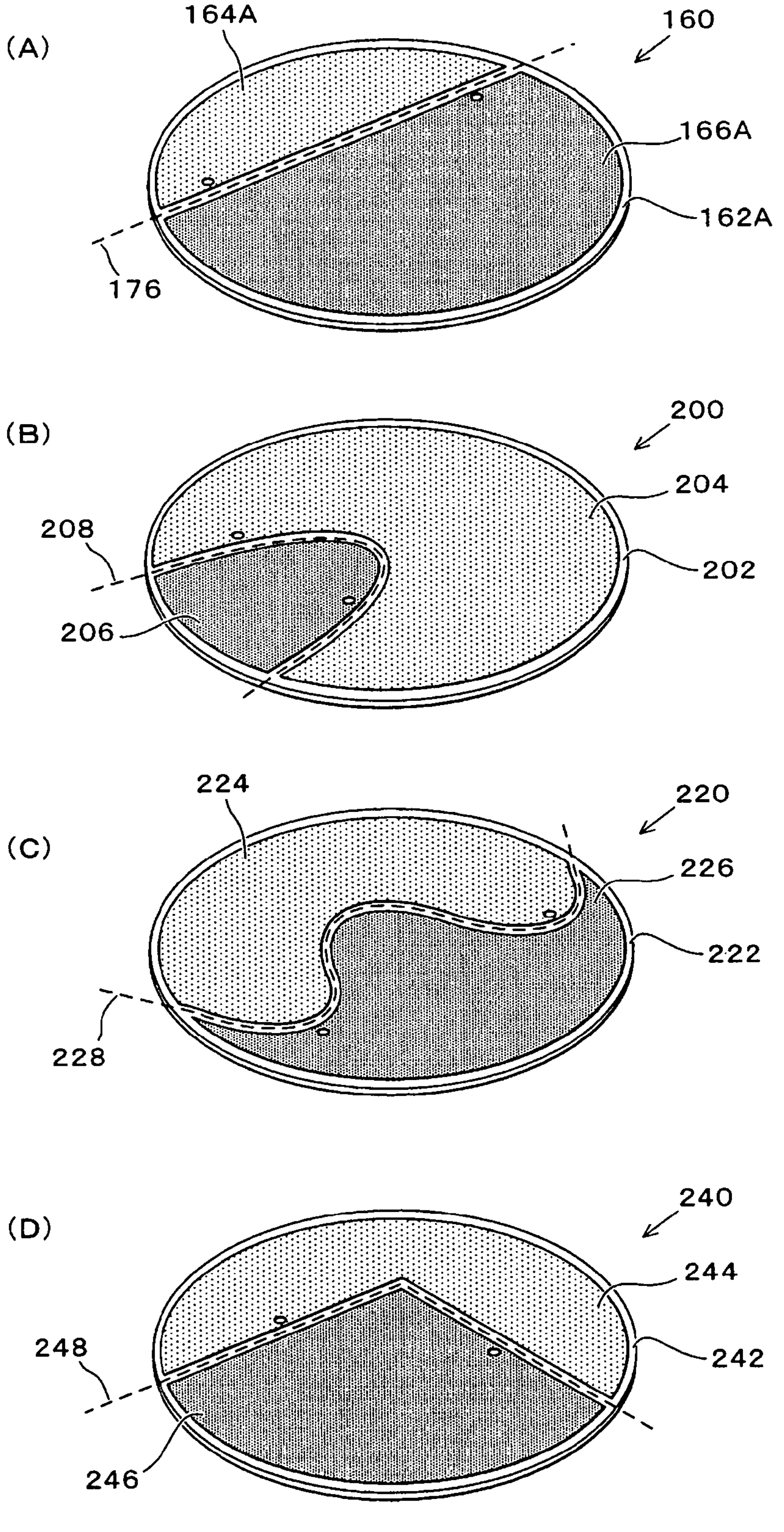
FIG. 8 is a perspective view showing an exterior of the fourth embodiment and modification thereto.

Referring to FIGS. 7 and 8, description is now made on a fourth embodiment of the invention. Although the first to third embodiments have arranged electrode layers in one pair, spaced from each other, with respect to a division line, as a boundary, passing the center of the main surface of the piezoelectric layer and dividing it nearly equal two parts, the present embodiment has a division line, of between the electrode layers, provided not to pass the center of the main surface of the piezoelectric layer. FIG. 7 is an exploded perspective view of the present embodiment. FIG. 8A is a perspective view showing the exterior view of a piezoelectric element in the present embodiment while FIGS. 8B-8D are views showing modifications to the present embodiment.

As shown in FIG. 7, a piezoelectric sounding body 150 is made in a unimorph structure that a piezoelectric element 160 is bonded on one main surface of a diaphragm 152, thus being made nearly circular in the entirety. In the diaphragm 152, a pair of printed conductor patterns 156, 158 are formed as lead electrode on the surface of an insulation sheet 154. The printed conductor pattern 156, in the illustrated example, is made in a form of a circle a part of which is removed while the other printed conductor pattern 158 is in a form of the removed part of the circle. Namely, the printed conductor patterns 156, 158 are formed separate with respect to a division line 176, as a boundary, not passing the center of the main surface of the diaphragm 152. The printed conductor patterns 156, 158 are formed greater in diameter than the piezoelectric element 160.

Meanwhile, the piezoelectric element 160 is structured by an alternate lamination of piezoelectric layers 162A, 162B and electrode layers 164A-164C, 166A-166C, so that the electrode layers are opposed sandwiching each of the piezoelectric layers. The piezoelectric layers 162A, 162B and the electrode layers 164A-164C, 166A-166C use, say, the materials similar to those in the first embodiment. Except that the division line 176 does not pass the center of the main surface of the piezoelectric layer, the piezoelectric element is similar in basic structure to that of the first embodiment. Namely, through-holes 168A, 168B, 170A, 170B are formed in the piezoelectric layers 162A, 162B, in proper positions off the division line 176. Projection forms 172, 174 are formed in respective opposite edges of the second electrode layers 164B, 166B, each of which extends to the opposite area beyond the division line 176.

In this structure, the electrode layers 164A-164C, to which a signal voltage in the same polarity is to be applied, are conductively connected together through use of the through-holes 168A, 168B and the projection form 172. The electrode layer 164C is bonded onto one printed conductor patterns 156 of the diaphragm 152. Meanwhile, the electrode layers 166A-166C are also conductively connected together through use of the through-holes 170A, 170B and the projection form 174. The electrode layer 166C is bonded onto the other printed conductor patterns 158. By connecting, say, leads 182, 184 respectively to the edges of the printed conductor patterns 156, 158 through solder 178, 180, signal voltage can be applied to the piezoelectric sounding body 150. According to this embodiment, by providing a division line 176 not passing the center of the piezoelectric layer, the region less strong, where no electrode layers exist, is provided off the center where displacement is to occur greatly in amount, thus providing an effect to reduce the stresses occurring on the piezoelectric body when driving the piezoelectric sounding body 150 or upon encountering an fall impact in addition to the effect of the first embodiment. For example, in this embodiment, stress caused can be decreased some twenty percent than those in the case of central division shown in the first embodiment.

Referring to FIGS. 8B-8D, description is now made on modifications to the invention. In the piezoelectric element 200 shown in FIG. 8B, electrode layers 204, 206 are arranged separate with respect to a curve division line 208, as a boundary, not passing the center of the piezoelectric layer 202. The electrode layers in plurality are conductively connected together in a thickness direction thereof, in positions off the division line 208. In the piezoelectric element 220 shown in FIG. 5C, electrode layers 224, 226 are arranged separate with respect to a waving division line 228, as a boundary, not passing the center of the piezoelectric layer 222. The electrode layers in plurality are conductively connected together in a thickness direction thereof, in positions off the division line 228. In the piezoelectric element 240 shown in FIG. 8D, electrode layers 244, 246 are arranged separate with respect to a bent division line 248, as a boundary, not passing the center of the piezoelectric layer 242. In any of the cases, it is possible to obtain an effect similar to that of the FIG. 7 piezoelectric sounding body 150. Of course, the electrode layer shapes shown in FIGS. 8A-8D are mere examples and hence electrode layer division may be made by combining straight and curve lines not passing the center of the piezoelectric layer.

Fifth Embodiment

Figure 9:
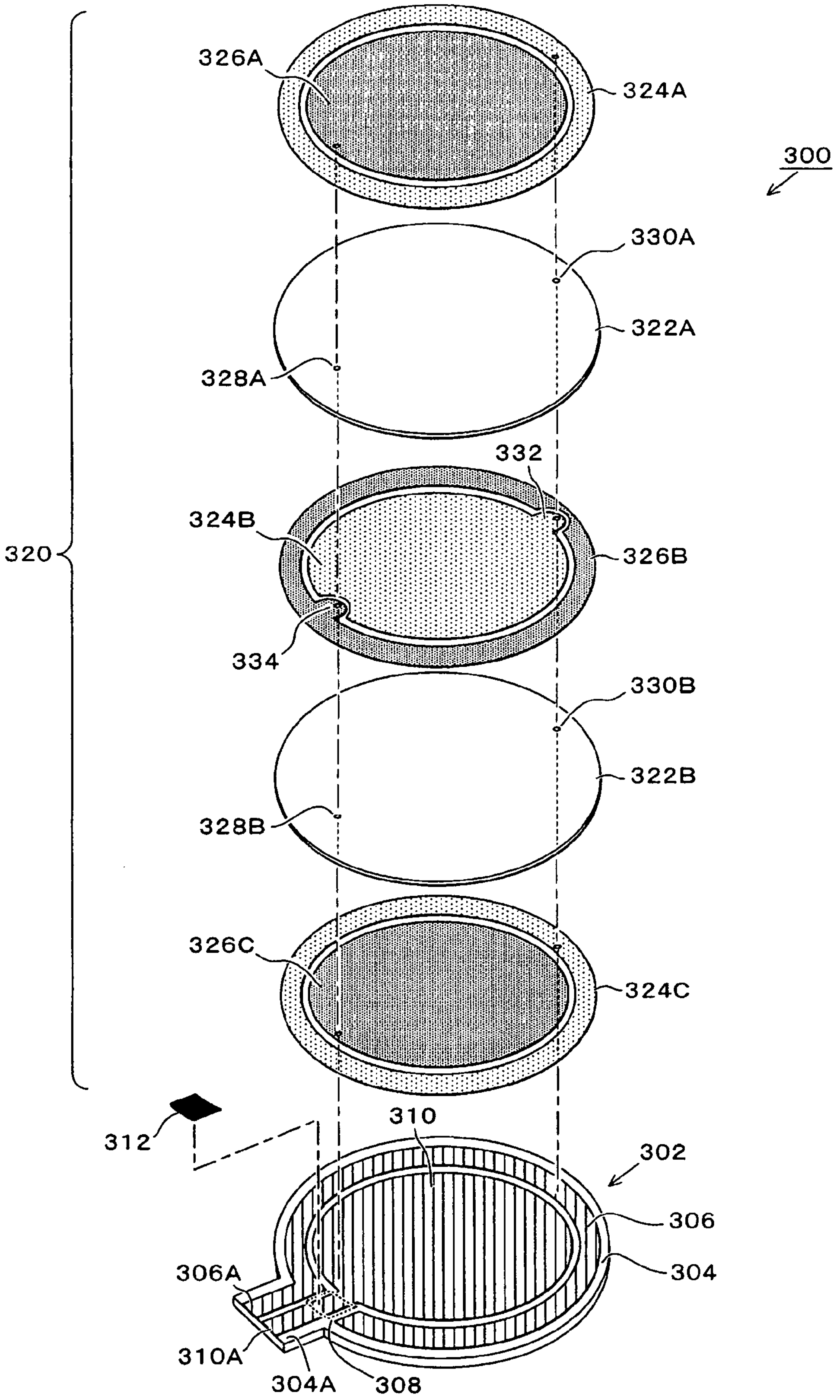
FIG. 9 is an exploded perspective view showing a structure of a fifth embodiment of the invention.
Figure 10:
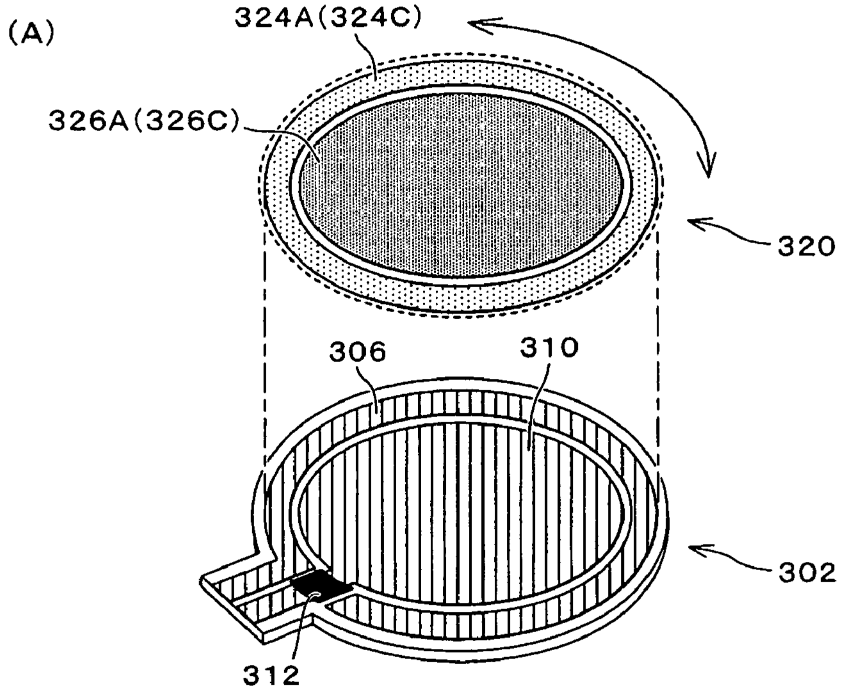
FIGS. 10A and 10B are views showing the manner of bonding of a piezoelectric element and diaphragm in the first and fifth embodiments.
Figure 10:
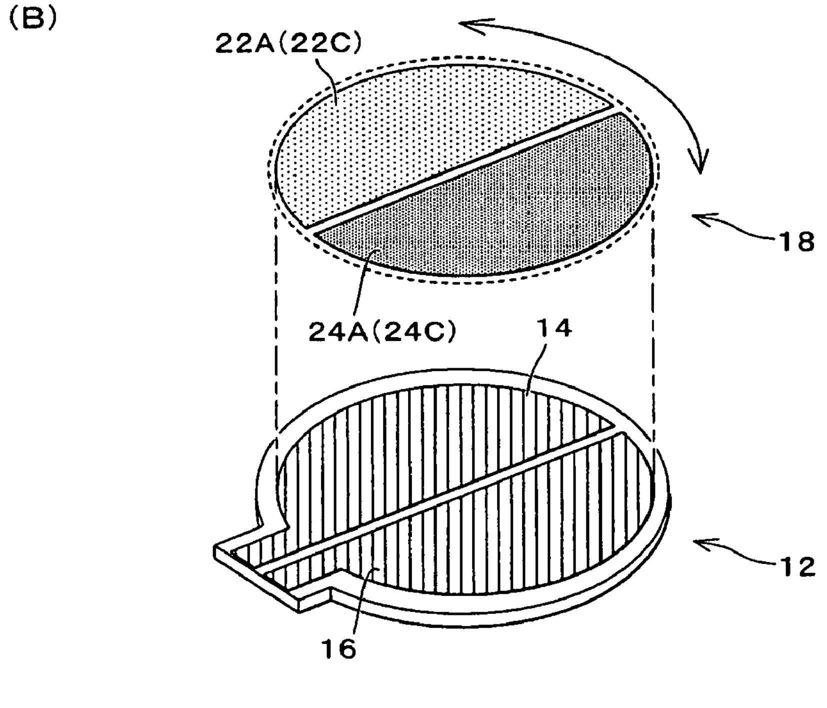
Figure 11:
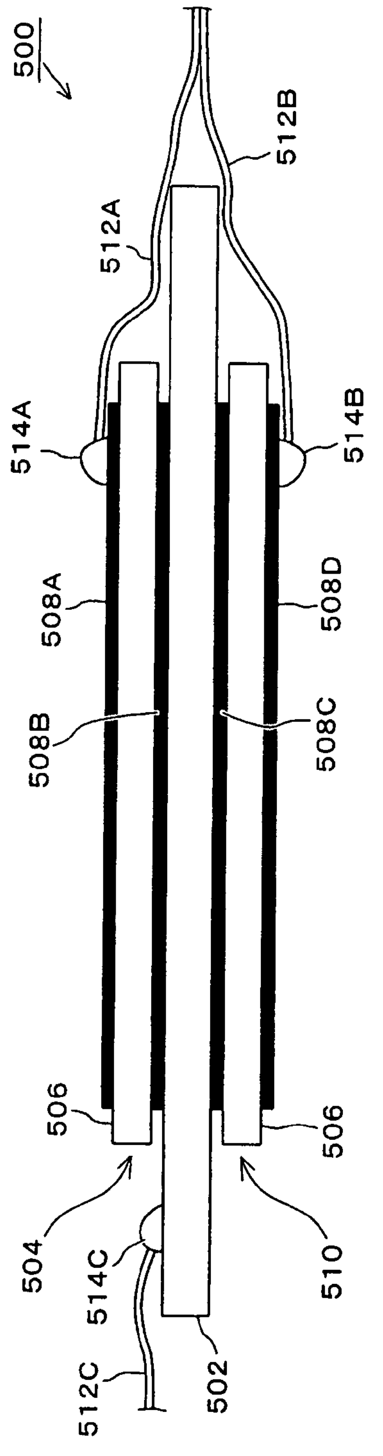
Fig. 11 (Background Art)
FIG. 11 is a view showing an example of the related art.

Referring to FIGS. 9 and 10, description is now made on a fifth embodiment of the invention. FIG. 9 is an exploded perspective view of the present embodiment. FIGS. 10A and 10B illustrates the manner of bonding the piezoelectric element according to the present embodiment and first embodiment onto a diaphragm. Although the first to fourth embodiments have arranged the electrode layers, spaced to each other, on respective areas the piezoelectric-layer main surface is divided by a straight or curve line into a plurality of parts, the fifth embodiment is to arrange electrode layers, spaced from each other, on respective areas the piezoelectric-layer main surface is divided nearly concentrically into a plurality of parts (divided into two in the illustrated example). As shown in FIG. 9, a piezoelectric sounding body 300 is made in a unimorph structure that a piezoelectric element 320 is bonded on one main surface of a diaphragm 302, thus being made nearly circular in the entirety.

Explaining first the diaphragm 302, a pair of printed conductor patterns 306, 310, for use as lead electrodes, are formed concentric on the surface of an insulation sheet 304, similarly to the foregoing embodiments. Meanwhile, a protrusion 304A is provided partly in an edge of the insulation sheet 304, which protrudes outward in the extension direction of a straight line passing the center of the insulation sheet 304. The printed conductor patterns 306, 310 are connected with respective lead areas 306A, 310A provided on the surface of the protrusion 304A. The printed conductor patterns 306, 310 are arranged, spaced from each other, on respective areas with respect to a circle, as a boundary, dividing diametrically the main surface of the insulation sheet 304 into inner and outer areas. The inner printed conductor pattern 310 is connected to the lead area 310A on the protrusion 304A through a slit 308 provided in circumferential one part of the outer printed conductor pattern 306. In the lead area 310A, an insulation layer 312 is provided in an area opposing to the outer electrode layer 324C of the piezoelectric element 320 in order to prevent the occurrence of a short at between the electrodes. Meanwhile, by applying an adhesive to the opposing area, displacement conveyance may be positively done at between the insulation sheet 304 and the piezoelectric element 320 while preventing an unwanted sound generation caused due to striking at non-adhered points.

Meanwhile, the piezoelectric element 320 is structured by an alternate lamination of piezoelectric layers 322A, 322B and electrode layers 324A-324C, 326A-326C, so that the electrode layers are opposed sandwiching each of the piezoelectric layers. On one main surface of the nearly circular piezoelectric layer 322A (on the upper surface in the illustrated example), there are formed a pair of electrode layers 324A, 326A, spaced to each other, on respective areas the main surface is concentrically divided into two parts so that signal voltages in different polarities can be applied to those. The electrode layers 324A, 326A are arranged as outer and inner areas with respect to a circle, as a boundary, dividing diametrically the piezoelectric layer 322A into two parts. This is the case with the second electrode layers 324B, 326B and the third electrode layers 324C, 326C. Those electrode layers are in a relationship of inner-and-outer inversion at between the both sides sandwiching the piezoelectric layer. Namely, arrangement is made such that a signal voltage in the same polarity is applied to the electrode layers 324A-324C while a signal voltage in the same polarity is applied to the electrode layers 326A-326C. Meanwhile, projection forms 332, 334 are formed respectively in proper positions of the second electrode layers 324B, 326B, each of which extends into the opposite area. Through-holes 328A, 330A, 328B, 330B are formed in proper positions of the piezoelectric layer 322A, 322B.

The electrode layers 324A-324C, to which a signal voltage in the same polarity is to be applied, are conductively connected together through use of the through-holes 330A, 330B and the projection form 332. The electrode layer 324C is bonded onto one printed conductor patterns 306 of the diaphragm 302. Meanwhile, the electrode layers 326A-326C are also conductively connected together through use of the through-holes 328A, 328B and the projection form 334. The electrode layer 326C is bonded onto the other printed conductor patterns 310. By connecting, say, not-shown leads respectively to the lead areas 306A, 310A of the printed conductor patterns 306, 310 through solder, signal voltage can be applied to the piezoelectric sounding body 300.

Comparing the present embodiment with the first embodiment, the first embodiment requires the effort to match the electrode shapes of the diaphragm 12 and the piezoelectric element 18 when bonding the piezoelectric element 18 to the diaphragm 12, as shown in FIG. 10B. On the contrary, by making the electrodes concentric in form as in this embodiment, there is no need to take account of electrode positional deviations upon bonding the piezoelectric element 320, as shown in FIG. 10A. Namely, even if the piezoelectric element 320 is rotated in a direction shown by arrow in the figure, connection is possible to the diaphragm without any problem as long as aligned at outer edges thereof. In this manner, the present embodiment can simplify the manufacturing process furthermore, in addition to the effect of the first embodiment.

Note that the invention is not limited to the foregoing embodiments but can be modified in various ways within the scope not departing from the gist of the invention. For example, those in the following are to be included.

(1) The materials, forms and dimensions shown in the embodiments are mere examples and can be changed suitably in a manner to effect the similar operation.

(2) The number of piezoelectric and electrode layers laminated is arbitrary, which may be increased and decreased properly as required.

(3) The piezoelectric sounding body, although made nearly rectangular or circular in entirety form in the embodiment, can be modified in form properly provided that effects are offered similarly.

(4) The electrode lead structure shown in the embodiment is mere one example and hence can be changed in design in a manner to provide the similar effect. For example, although the embodiment used the diaphragm with printed conductor patterns formed on an insulation sheet, the diaphragm per se may be formed by a conductive, flexible thin sheet and divided, for insulation, in a position nearly the same as the electrode layers of the piezoelectric element.

(5) Although the embodiments were of the unimorph structure having a piezoelectric element on one main surface of a diaphragm, effects are to be obtained similarly if made in a bimorph structure having piezoelectric elements on both surfaces thereof (6) The embodiment provided electrode layers on respective areas where the main surface of the piezoelectric element is divided into two parts. This, however, is mere one example, i.e. the number of parts divided may be changed to provide effects similarly.

(7) The piezoelectric sounding body in the invention is suitably applied to the speakers for various electronic devices, including cellular phones, personal digital assistants (PDAs), voice recorders and PCs (personal computers) without restriction of the applications to other various well-known electronic devices.

According to the invention, a piezoelectric element has at least one piezoelectric layer and electrode layers respectively provided on the main surfaces of the piezoelectric layer in a manner sandwiching the piezoelectric layer, which piezoelectric element is bonded at least one surface of a diaphragm. The electrode layers are arranged separate, spaced from each other, on respective areas that the main surface of the piezoelectric layer is divided into a plurality of parts, in a manner being placed substantially same in position at between the both main surfaces sandwiching the piezoelectric layer. Conductive connection is provided, thicknesswise of the piezoelectric layer, between one of the electrode layers on a main surface of the piezoelectric layer and the electrode layer opposed, sandwiching the piezoelectric layer, to another of the electrode layers that is adjacent to the one electrode layer on the same main surfaces, in positions where overlapping with any of the electrode layers on the main surface. This can be suitably applied to a piezoelectric sounding body requiring thickness reduction and for an electronic device using same.

The present application claims priority to Japanese Patent Application No. 2005-100867, filed Mar. 31, 2005, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A piezoelectric sounding body for a sound producer, characterized by comprising:

- a piezoelectric element comprising at least one piezoelectric layer and electrode layers respectively provided on opposed main surfaces of the piezoelectric layer in a manner sandwiching the piezoelectric layer,
- wherein each main surface of the piezoelectric layer is divided into multiple sections, and each electrode layer is divided and separated to produce corresponding electrode layer sections disposed in positions which are substantially the same on both main surfaces of the piezoelectric layer;
- a diaphragm having surfaces to at least one of which the piezoelectric element is bonded; and
- a plurality of connectors each connecting, thicknesswise of the piezoelectric layer, a first electrode layer section on a first main surface of the piezoelectric layer to a differently disposed electrode layer section on a second main surface of the piezoelectric layer in a position where a portion of the differently disposed electrode layer section overlaps a portion of the first electrode layer section.

2. The piezoelectric sounding body according to claim 1, wherein at least one of the plurality of connectors comprises a through-hole.

3. The piezoelectric sounding body according to claim 1, wherein a plurality of lead electrodes are provided, on a main surface of the diaphragm, that are conductively connected respectively to the divided multiple sections of the electrode layer on each main surface of the piezoelectric layer.

4. The piezoelectric sounding body according to claim 1, wherein each electrode layer is divided into the multiple sections using a division line, as a boundary, not passing a center of the main surface of the piezoelectric layer.

5. The piezoelectric sounding body according to claim 1, wherein each electrode layer on the same main surface of the piezoelectric layer is divided into the multiple sections arranged substantially concentric about a center of the piezoelectric layer.

6. An electronic device comprising a piezoelectric sounding body according to claim 1 is used.

7. A piezoelectric sounding body comprising:

- a piezoelectrie element comprising at least one piezoelectric layer and electrode layers respectively provided on opposed main surfaces of the piezoelectric layer in a manner sandwiching the piezoelectric layer; and
- a diaphragm having surfaces to at least one of which the piezoelectric element is bonded;
- wherein each main surface of the piezoelectric layer is divided into multiple sections, and each electrode layer is divided and separated to produce corresponding electrode layer sections disposed in positions which are substantially the same on both main surfaces of the piezoelectric layer, wherein the multiple sections of the electrode layer include sections 1A and 2A which are divided along a division line A, and the multiple sections of the other opposing electrode layer include sections 1B and 2B which are divided along a division line B which is substantially identical to the division line A with respect to the thicknesswise direction, wherein the sections 1A and 2A correspond to the sections 1B and 2W respectively, with respect to their positions in the thieknesswise direction, wherein the sections 1B and 2B each have a protrusion and a recess along the division line B, respectively, which correspond to each other and deviate from the division line A with respect to the thicknesswise direction, wherein the protrusion of the section 1B overlaps the section 2A with respect to the thicknesswise direction and is connected to the section 2A with a connector and the protrusion of the section 2B overlaps the section 1A with respect to the thicknesswise direction and is connected to the section 1A with a connector.

8. A piezoelectrie sounding body comprising:

(a) a piezoeleetric element comprising:

(i) at least one piezoelectric layer having upper and lower surfaces; and (ii) upper and lower electrode layers sandwiehing each piezoelectric layer, said upper and lower electrode layers being each divided into multiple sections disposed on the respective sqrfaces of the piezoelectric layer, positions of the multiple sections of the upper electrode layer on the upper surface of the piezoeleetrie layer substantially or nearly correspond to positions of the multiple sections of the lower electrode layer on the lower surface of the piezoelectric layer, respectively, in a thickness direction of the piezoelectric layer via the piezoelectric layer, with the exception of a protruding portion provided in each given section of the upper or lower electrode layer and protruding toward an adjacent section of the upper or lower electrode, wherein each given section of the upper or lower electrode layer overlaps the adjacent section of the lower or upper electrode layer, respectively, at the protruding portion in the thickness direction of the piezoelectric layer;

(b) connectors, each connecting each section of the upper and lower electrode layers at the protruding portion; and (c) a diaphragm having surfaces, to at least one of which surfaces the piezoelectric element is attached.

9. The piezoelectric sounding body according to claim 8, wherein the protruding portion has an area which is less than about 10% of the area of the given section of the upper or lower electrode layer.

10. The piezoelectric sounding body according to claim 9, wherein the protruding portion has an area which is less than about 5% of the area of the given section of the upper or lower electrode layer.

* * * * *

UNITED STATES PATENT AND TRADEMARK OFFICE

CERTIFICATE OF CORRECTION

PATENT NO. : 7,447,324 B2
APPLICATION NO. : 11/390620
DATED : November 4, 2008
INVENTOR(S) : Tatsuyuki Ogawa et al.

It is certified that error appears in the above-identified patent and that said Letters Patent is hereby corrected as shown below:

At Column 1, Line 34, please delete “512A 512C” and insert therefore, --512A-512C--.

At Column 4, Line 2, please delete “106A/108A:” and insert therefore, --106A, 108A:--.

At Column 4, Line 19, please delete “32BB,” and insert therefore, --328B,--.

At Column 6, Line 19, please delete “2GB” and insert therefore, --26B--.

At Column 7, Line 60, please delete “112A/112B” and insert therefore, --112A, 112B--.

At Column 9, Line 36, please delete “FIG. 5C,” and insert therefore, --FIG. 8C,--.

At Column 12, Line 56, please delete “piezoelectrie” and insert therefore, --piezoelectric--.

At Column 12, Line 61, please delete “bonded;” and insert therefore, --bonded,--.

At Column 13, Line 2, please delete “lA” and insert therefore, --1A--.

At Column 13, Line 8, please delete “2W” and insert therefore, --2B,--.

At Column 13, Line 9, please delete “thieknesswise” and insert therefore, --thicknesswise--.

At Column 13, Line 16, please delete “connector” and insert therefore, --connector,--.

UNITED STATES PATENT AND TRADEMARK OFFICE

CERTIFICATE OF CORRECTION

PATENT NO. : 7,447,324 B2
APPLICATION NO. : 11/390620
DATED : November 4, 2008
INVENTOR(S) : Tatsuyuki Ogawa et al.

It is certified that error appears in the above-identified patent and that said Letters Patent is hereby corrected as shown below:

At Column 13, Line 20, please delete “piezoelectrie” and insert therefore,

--piezoelectric--.

At Column 13, Line 21, please delete “piezoeleetric” and insert therefore,

--piezoelectric--.

At Column 13, Line 24, please delete “sandwiehing” and insert therefore,

--sandwiching--.

At Column 13, Line 27, please delete “sqrfaces” and insert therefore,

--surfaces--.

At Column 14, Line 1-2, please delete “piezoeleetrie” and insert therefore,

--piezoelectric--.

Signed and Sealed this

Twenty-eighth Day of July, 2009

John Doll

JOHN DOLL
*Acting Director of the United States Patent and Trademark Office*